US008065642B1

(12) United States Patent
Corbett (10) Patent No.: US 8,065,642 B1
(45) Date of Patent: Nov. 22, 2011

(54) ISOLATION VERIFICATION FOR IMPLEMENTING MODULAR REDUNDANCY WITHIN PROGRAMMABLE INTEGRATED CIRCUITS

(75) Inventor: John D. Corbett, Monte Sereno, CA (US)

(73) Assignee: Xilinx, Inc., San Jose, CA (US)

( * ) Notice: Subject to any disclaimer, the term of this patent is extended or adjusted under 35 U.S.C. 154(b) by 488 days.

(21) Appl. No.: 12/338,339

(22) Filed: Dec. 18, 2008

(51) Int. Cl.
*G06F 17/50* (2006.01)
(52) U.S. Cl. ......... 716/106; 716/104; 716/111; 716/116
(58) Field of Classification Search .................. 716/104, 716/106, 116, 117, 111
See application file for complete search history.

(56) References Cited

U.S. PATENT DOCUMENTS

| | | | |
|---|---|---|---|
| 5,210,756 A * | 5/1993 | Kummer et al. | 714/4.2 |
| 6,624,654 B1 | 9/2003 | Trimberger | |
| 6,720,793 B1 | 4/2004 | Trimberger | |
| 6,812,731 B1 | 11/2004 | Trimberger | |
| 7,949,974 B1 * | 5/2011 | Moore et al. | 716/111 |

OTHER PUBLICATIONS

Xilinx, Inc.; U.S. Appl. No. 12/038,837, filed Feb. 28, 2008 by Moore et al.

* cited by examiner

*Primary Examiner* — Sun Lin
(74) *Attorney, Agent, or Firm* — Kevin T. Cuenot; Lois D. Cartier (57) ABSTRACT

A computer-implemented method of verifying isolation of a plurality of instances of a redundant module of a circuit design that is implemented within a single, programmable integrated circuit can include counting component failures needed to establish a connection between at least two different ones of the plurality of instances of the redundant module. The method can include determining whether each instance of the redundant module is isolated from each other instance of the redundant module according to the counting of component failures, and outputting an indication whether each of the plurality of instances of the redundant module is isolated.

20 Claims, 5 Drawing Sheets

ISOLATION VERIFICATION FOR IMPLEMENTING MODULAR REDUNDANCY WITHIN PROGRAMMABLE INTEGRATED CIRCUITS

FIELD OF THE INVENTION

The embodiments disclosed herein relate to programmable integrated circuit devices (ICs). More particularly, the embodiments relate to ensuring that each instance of a module that is implemented with redundancy within a programmable IC is isolated from other instances of the same module.

BACKGROUND

Programmable integrated circuits (ICs) are a well-known type of integrated circuit (IC) that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). In general, a PIP refers to a circuit component or mechanism that programmably connects or isolates two routing elements, e.g., wires or nodes, of a circuit within a programmable IC. The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some applications require that portions of the system be implemented in triplicate to improve reliability. This technique, referred to as triple modular redundancy (TMR), seeks to eliminate single points of failure within a circuit design. For example, systems that are to be used within harsh operating environments may require that one or more circuits critical to continued and proper operation of the system be implemented using TMR. A voting circuit can be used to select the majority result, as determined from the output of each of the three instances of the module implemented using TMR, referred to as the "TMR module." An "instance" of a TMR module refers to a single one of the three implementations of a TMR module, or to a single implementation of any module implemented using redundancy of any sort. TMR can improve the ability of a system to function properly despite the occurrence of faults, whether accidental or malicious in nature.

When implementing a TMR module, each instance of that TMR module must be isolated from each other instance of the TMR module. Isolation of instances of a TMR module means that the occurrence of a fault within one instance of the TMR module is independent of whether a fault occurs within any other instance of the TMR module. Proceeding with the presumption that the probability of a single failure is low, then the probability of two independent failures, each occurring within a different instance of the same TMR module, will be even lower. This increases the likelihood that the majority result selected by the voting mechanism will be the intended or correct result.

The conventional technique for achieving isolation in a circuit design among instances of a module implemented with any degree of redundancy is to design the system so that each instance of the redundant module is located within a separate, physical, programmable IC. Implementing a system in this manner, using a plurality of programmable ICs for implementation of a single redundant module, may add significant cost and complexity to the system design. Further, the resulting system will be physically larger and require more power than if a single programmable IC were used.

SUMMARY

The embodiments disclosed herein relate to ensuring that each instance of a module of a circuit design to be implemented with redundancy is isolated from the other instances of the module when implemented within a single, programmable integrated circuit (IC). One embodiment of the present invention can include a computer-implemented method of verifying isolation of a plurality of instances of a redundant module of a circuit design that is implemented within a single, programmable IC. The method can include counting component failures to establish a connection between at least two different ones of the plurality of instances of the redundant module. The method can include determining whether each instance of the redundant module is isolated from each other instance of the redundant module according to the counting of component failures and outputting an indication whether each of the plurality of instances of the redundant module is isolated.

Counting component failures can include selecting a node within a selected instance of the redundant module, building a path of connecting nodes from the selected node, and determining whether the selected instance of the redundant module is isolated according to whether the path includes a node of an instance of the redundant module other than the selected instance of the redundant module and a cost of the path determined according to a number of component failures required to build the path.

The method also can include, when a cost of the path exceeds a minimum threshold and the path does not include a node of an instance of the redundant module other than the selected instance of the redundant module, determining that the path is isolated. When a cost of the path does not exceed a minimum threshold and the path includes a node of an instance of the redundant module other than the selected instance of the redundant module, a determination can be made that the path is not isolated.

The method can include determining that a first instance of the redundant module is not isolated from at least a second instance of the redundant module when a package pin of the first instance of the redundant module is within a predetermined distance of a package pin of the second redundant module. The method also can include determining that a first instance of the redundant module is not isolated from at least a second instance of the redundant module when an input/output (I/O) buffer of the first instance of the redundant module is within a predetermined distance of an I/O buffer of the second instance of the redundant module.

The method further can include determining that at least two different instances of the redundant module are not isolated from one another when an I/O bank of the programmable integrated circuit includes an I/O buffer from the at least two different instances of the redundant module. The method can include determining that a first instance of the redundant module is not isolated from a second instance of the redundant module when a selected circuit component, disposed within the first instance of the redundant module, is located less than a predetermined distance from a boundary of the second instance of the redundant module.

Another embodiment of the present invention can include a computer-implemented method of verifying isolation of a plurality of instances of a redundant module of a circuit design that is implemented within a single, programmable IC. The method can include determining whether each instance of the redundant module is separated from each other instance of the redundant module on the programmable IC by a channel including at least one isolation characteristic. An indication of whether each of the plurality of instances of the redundant module is isolated can be output according to whether the channel includes the at least one isolation characteristic.

The method can include selecting the isolation characteristic to be a number of circuit components that are not members of any of the plurality of instances of the redundant module that span a width of the channel. The method also can include selecting the isolation characteristic to be whether the channel includes a selected type of circuit element that is not a member of any of the plurality of instances of the redundant module.

The method can include determining whether a package pin of a first instance of the redundant module is within a predetermined distance of a package pin of at least a second instance of the redundant module and, when the package pin of the first instance of the redundant module is within the predetermined distance of the package pin of the second instance of the redundant module, outputting an indication that the first instance of the redundant module is not isolated from the second instance of the redundant module.

The method also can include determining whether an I/O buffer of a first instance of the redundant module is within a predetermined distance of an I/O buffer of at least a second instance of the redundant module and, when the I/O buffer of the first instance of the redundant module is within the predetermined distance of the I/O buffer of the second instance of the redundant module, outputting an indication that the first instance of the redundant module is not isolated from the second instance of the redundant module.

The method further can include determining whether an I/O bank of the programmable integrated circuit includes an I/O buffer from at least two different instances of the redundant module and, when an I/O bank of the programmable integrated circuit includes an I/O buffer from at least two different instances of the redundant module, outputting an indication that the at least two different instances of the redundant module are not isolated from one another.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed herein relate to ensuring that each instance of a module implemented using redundancy is properly isolated from other instances of the same redundant module when each instance of that module is implemented within a same programmable integrated circuit (IC). As used within this specification, "isolation" can refer to a condition in which an occurrence of a failure within one instance of a redundant module can be considered to be independent of whether a failure occurs within another instance of the same redundant module. In the context of modular redundancy, a module will be replicated multiple times within the same programmable IC. Each replication, or instance, of that module, referred to as the redundant module, must be isolated from each other instance of that same redundant module. Instances of different redundant modules, however, need not be isolated from one another, as will be described in greater detail within this specification.

Isolation between different instances of a same redundant module of the circuit design can be analyzed with respect to selected attributes of the circuit design, combined with an understanding of the underlying physical circuit structures of the programmable IC (the "target device") within which the circuit design is to be implemented. These attributes can include, for example, circuit routing, package pins (pins), input/output (I/O) buffers, I/O banks, or the like. Such attributes, to be described herein in greater detail, can be identified from a review of the programmatic description of the circuit design at any of a variety of stages throughout the implementation process. By comparing attributes of the circuit design with various isolation criteria, verification that each instance of a redundant module is isolated from each other instance of the same redundant module can be provided.

In general, to verify that one instance of a redundant module is isolated from each other instance of the same redundant module, the number of failures that would be required to create a functional dependency from one instance of the redundant module to another instance of the redundant module can be determined. When the number of such failures required to establish a dependency exceeds some minimum threshold number of failures, the two instances of the redundant module can be said to be isolated from one another.

Figure 1:
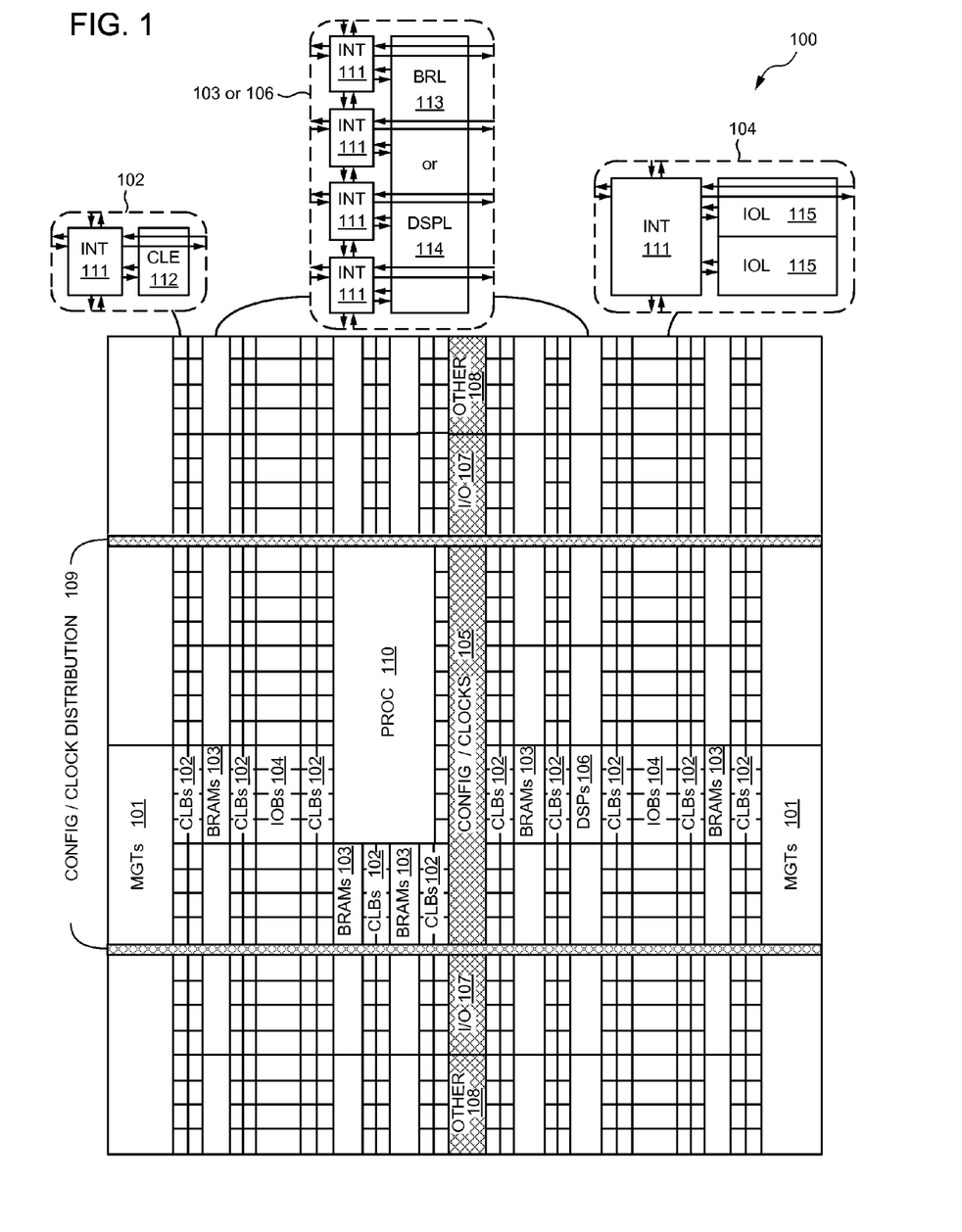
FIG. 1 is a first block diagram illustrating an example of a field programmable gate array type of programmable integrated circuit (IC).

FIG. 1 is a first block diagram illustrating an example of a field programmable gate array (FPGA) type of programmable IC. FPGAs are only one type of programmable IC to which the methods and computer program products of the invention can be applied.

As noted, advanced FPGAs can include several different types of programmable logic blocks in the array. For example, FIG. 1 illustrates an FPGA architecture 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110.

In some FPGAs, each programmable tile includes a programmable interconnect element (INT) 111 having standardized connections to and from a corresponding interconnect element in each adjacent tile. Therefore, the programmable interconnect elements, taken together, implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL) 114 in addition to an appropriate number of programmable interconnect elements.

An IOB 104 can include, for example, two instances of an I/O logic element (IOL) 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115. The IOB 104 also can include an I/O buffer (not shown).

In the pictured embodiment, a columnar area near the center of the die is used for configuration and/or clocks 105, and other control logic 108. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 is intended to illustrate an example of an FPGA architecture. For instance, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

It should be appreciated that other types of programmable ICs may be utilized with the embodiments disclosed within this specification. Such devices can include, for example, complex programmable logic devices (CLPDs), programmable logic arrays (PLAs), and programmable array logic (PAL) devices. The phrase "programmable IC," as used within this specification can include devices that are fully programmable as well as those that are only partially programmable. For example, one type of programmable IC includes a combination of hard-coded transistor logic and a programmable switch fabric that programmably interconnects the hard-coded transistor logic.

Figure 2:
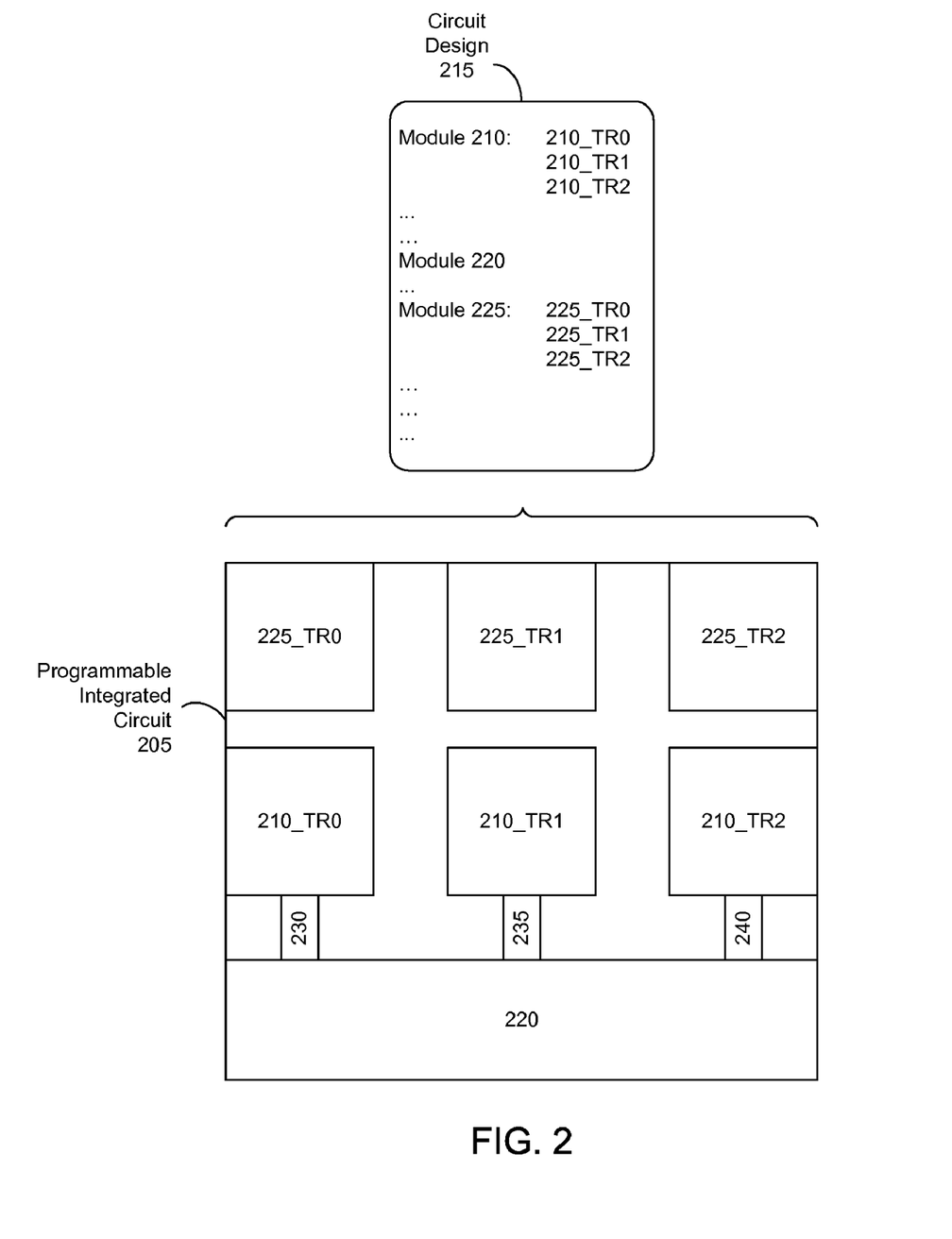
FIG. 2 is a second block diagram illustrating a programmable IC having modules that are implemented with redundancy, in accordance with one embodiment of the present invention.

FIG. 2 is a second block diagram illustrating a programmable IC 205 having modules that are implemented with redundancy, in accordance with one embodiment of the present invention. For purposes of illustration, triple modular redundancy (TMR) is illustrated in FIG. 2 and is used, from time to time, to provide examples throughout the specification. TMR is used to illustrate various aspects of the embodiments described. The embodiments disclosed within this specification, however, are not intended to be limited solely to situations in which TMR is used. Rather, the embodiments disclosed within this specification can be applied to any of a variety of cases where a module is to be implemented with redundancy, whether that module is implemented within a programmable IC with two instances, three instances, or more than three instances.

Programmable IC 205 can include a module 210 and a module 225, each implemented with redundancy. As noted, in this example the type of redundancy is TMR. Programmable IC 205 can be any of a variety of different types of programmable ICs, as discussed. As pictured, a circuit design 215 can specify a circuit to be implemented within programmable IC 205. Circuit design 215 can be a programmatic description of the circuit. For example, circuit design 215 can be specified as a hardware description language (HDL) file or files, as a netlist, a directed acyclic graph, or the like.

In one embodiment, circuit design 215 can specify complete placement and routing information for the circuit. In another embodiment, circuit design 215 may not include complete placement and/or routing information. Circuit design 215 may be a more abstract representation of the circuit to be implemented, e.g., a circuit representation at a preliminary stage where placement and routing information have not yet been specified or determined. For example, circuit design 215 may specify one or more user design constraints for the circuit to be implemented. The user design constraints can specify information such as module size and placement on the target device, e.g., programmable IC 205, pin placement, and the like.

In the case of an FPGA type of programmable IC, circuit design 215 can be converted into a bitstream that, when loaded into programmable IC 205, configures programmable IC 205 to implement circuit design 215. As is known, a bitstream can specify connectivity within programmable IC 205 in terms of which processing elements are included, or linked into, the circuit, the configuration of each processing element, and the like. Accordingly, circuit design 215 also may specify unused circuit elements. As used herein, an "unused" circuit element refers to a physical circuit element on programmable IC 205 that is not electrically, optically, magnetically, or otherwise communicatively linked with the circuit implemented on programmable IC 205.

Circuit design 215 can specify one or more modules such as modules 210, 220, and 225. In this example, module 210 and module 225 are designated as redundant modules. Modules that are to be implemented using TMR, or any other type of redundancy, can be annotated as such within circuit design 215. For example, each module to be implemented as a TMR module can have a suffix of "_TRN," where the letters "TR" represent "triple redundancy." The letter "N" can be an integer value of, for example, 0, 1, or 2 in reference to each of the three instances of the redundant module. Within circuit design 215, the three instances of redundant module 210 can be denoted as 210_TR0, 210_TR1, and 210_TR2. Thus, each instance of redundant module 210 can be expressed independently. Similarly, the three instances of redundant module 225 can be denoted as 225_TR0, 225_TR1, and 225_TR2. As with redundant module 210, each instance of redundant module 225 can be expressed or represented independently as shown.

Following this convention, each component and signal of an instance of a redundant module can be represented in the same manner. That is, each component and wire of the first instance of redundant module 210, corresponding to instance 210_TR0, can have a suffix of "_TR0" appended thereto. Each component and wire of the second instance of redundant module 210, corresponding to instance 210_TR1, can have a suffix of "TR1". Each component and wire of the third instance of redundant module 210, corresponding to instance 210_TR2, can have a suffix of "TR2". Components within redundant module 225 can be annotated in the same manner. It should be appreciated that if more than one module is to be implemented as a redundant module, further identifiers can be used to indicate to which redundant module a given instance corresponds.

As noted, each instance of a redundant module must be isolated from each other instance of the same redundant module. Since each instance of a redundant module is, effectively, a complete and independent module of the circuit design, each of instances 210_TR0, 210_TR1, and 210_TR2 of redundant module 210 may be considered to be modules in and of themselves. The same can be said of each of instances 225_TR0, 225_TR1, and 225_TR2 of redundant module 225. In this regard, it should be appreciated that any reference to a module within this specification will apply to an instance of a redundant module.

For purposes of illustration, consider the case where module 210 and module 225 are instantiations of a same module referred to as module A. Each instantiation of module A, referring to modules 210 and 225, is to be implemented using TMR. This results in instance 210_TR0, instance 210_TR1, instance 210_TR2, instance 225_TR0, instance 225_TR1, and instance 225_TR2 being implemented within programmable IC 205. Thus, each of instances 210_TR0, 210_TR1, and 210_TR2 should be isolated from one another. Similarly, each of instances 225_TR0, 225_TR1, and 225_TR2 should be isolated from one another. Instances of redundant module 210, however, need not be isolated from instances of redundant module 225. For example, instance 210_TR0 need not be isolated from any of instances 225_TR0, 225_TR1, or 225_TR2. The same can be said with respect to instances 210_TR1 and 210_TR2 not being isolated with respect to instances 225_TR0, 225_TR1, or 225_TR2.

Since circuit design 215 may be hierarchical in nature, the designation of a given module of circuit design 215 as being a redundant module through insertion of a redundancy parameter within circuit design 215 may be done at any desired level within the hierarchy. The redundancy parameter can be applied to each portion of circuit design 215, e.g., networks, I/O pins, I/O buffers, or other circuit elements, below the level at which the redundancy parameter is inserted within the hierarchy. For example, after specifying a particular module as a TMR module, circuit implementation tools can triplicate the redundant module within the circuit design and append the suffixes to the respective components, signals, and so forth of each resulting instance of the redundant module as described.

FIG. 2 illustrates each of the modules specified within circuit design 215 as they will be implemented within programmable IC 205. For example, the location and size of each module is illustrated within programmable IC 205 after mapping, placement, and routing, or, alternatively, as determined according to one or more user-specified constraints prior to mapping, placement, and/or routing. As represented within programmable IC 205, each module now occupies a particular geographic or physical region of programmable IC 205.

For purposes of illustration, the same numbers are used to reference modules in circuit design 215 and those same modules as implemented within a region of programmable IC 205. When referencing modules or instances within programmable IC 205, the term "region" may be used. When an instance is found to be isolated, the region of programmable IC 205 within which that instance is instantiated also can be said to be isolated. Still, the specification may use the terms "module" and "region" interchangeably from time to time when discussing isolation of portions of a circuit design. A reference to a particular region on the programmable IC 205 may also refer to the particular module, or instance of the module, that is implemented within that region.

For example, circuit design 215 indicates that module 210 is a redundant module. Accordingly, instances 210_TR0, 210_TR1, and 210_TR2 are to be isolated from one another. As shown in programmable IC 205, each of regions 210_TR0, 210_TR1, and 210_TR2 is isolated, as will be described in further detail. As pictured, each circuit element of each isolated module will be located within the region of programmable IC 215 that has the same reference number as the corresponding module from circuit design 215. In general, the circuit elements of each respective isolated instance of a redundant module are not distributed throughout programmable IC 205, in an effort to efficiently utilize circuit resources or influence timing, as otherwise may occur during implementation of circuit design 215.

An instance of a redundant module may be isolated and still communicate with one or more other modules. Such communication will be explicitly allowed or specified within circuit design 215. Accordingly, in one embodiment, various exemptions can be observed that, if present in circuit design 215, will not influence the determination of whether an instance of a redundant module is isolated. Exempted circuit structures, e.g., circuitry, can be identified within circuit design 215 and tagged or otherwise marked.

For example, shared circuit 230 couples region 210_TR0 with region 220. Shared circuit 235 couples region 210_TR1 with region 220. Shared circuit 240 couples region 210_TR2 with region 220. In this example, region 220 can define a voting circuit that compares results of each instance of redundant module 210. Shared circuits 230, 235, and 240 will be specified directly within circuit design 215. Without such connectivity, circuit design 205 would not function properly or as intended. Shared circuits can be ignored when determining whether each instance of redundant module 210 is isolated, e.g., whether each of regions 210_TR0, 210_TR1, and 210_TR2 is isolated.

In one embodiment, each of shared circuits 230, 235, and 240 may be implemented as a bus macro. A bus macro can refer to a software construct that can be included within a circuit design that causes a predefined sub-circuit to be implemented. The predefined sub-circuit can include a specific arrangement of blocks and routing resources that has been shown to make a safe connection.

In some applications, clock networks and power networks are not considered when determining whether a module is isolated. In the context of modular redundancy, however, such networks can be evaluated when determining whether each instance of a redundant module is isolated. That is, the clock network and the power network for each of instances 210_TR0, 210_TR1, and 210_TR2 can be included in the isolation analysis. On the other hand, panic alarm resets and other global system resources may be considered to be non-isolated or exempt. Any resources designated as exceptions or exempt can be ignored when determining whether a module is isolated.

The examples provided within this specification are for purposes of illustration only. It should be appreciated that the embodiments disclosed herein can be applied to any portions of a circuit design to be implemented within a programmable IC using redundancy for virtually any reason. Using conventional system design techniques, each instance of redundant module 210 or redundant module 225 would be implemented within a different programmable IC.

In accordance with the embodiments disclosed herein, different attributes of circuit design 215 can be identified as indicators of whether instances of redundant modules are, or will be, isolated when implemented within programmable IC 205. Each of the attributes described within this specification, taken alone or in combination with one or more other attributes, when found to exist in circuit design 215, can serve as a proxy for an instance being considered isolated. By ensuring that one or more of these attributes is present within circuit design 215, in various combinations, instances of a redundant module can be implemented within a same programmable IC while ensuring that each instance of the redundant module is isolated from each other instance of the redundant module. A software-based analysis tool executing within a computing system can be configured to identify whether circuit design 215 specifies the circuit attributes necessary for instances of a redundant module to be considered isolated when located within the same programmable IC.

To verify that one instance of a redundant module is isolated from each other instance of the same redundant module, the number of failures that would be required to create a functional dependency from one instance of the redundant module to any other instance of the redundant module can be determined. A functional dependency, for example, referring to a redundant module with each instance outputting to a voting circuit, would mean that a fault within one instance influences or changes the output of another instance of the same redundant module. This condition indicates a lack of independence among instances of the redundant module. When the number of faults required for one instance to influence the output of another instance of the same redundant module exceeds some minimum threshold number of failures, the two instances of the redundant module can be said to be isolated from one another.

Figure 3:
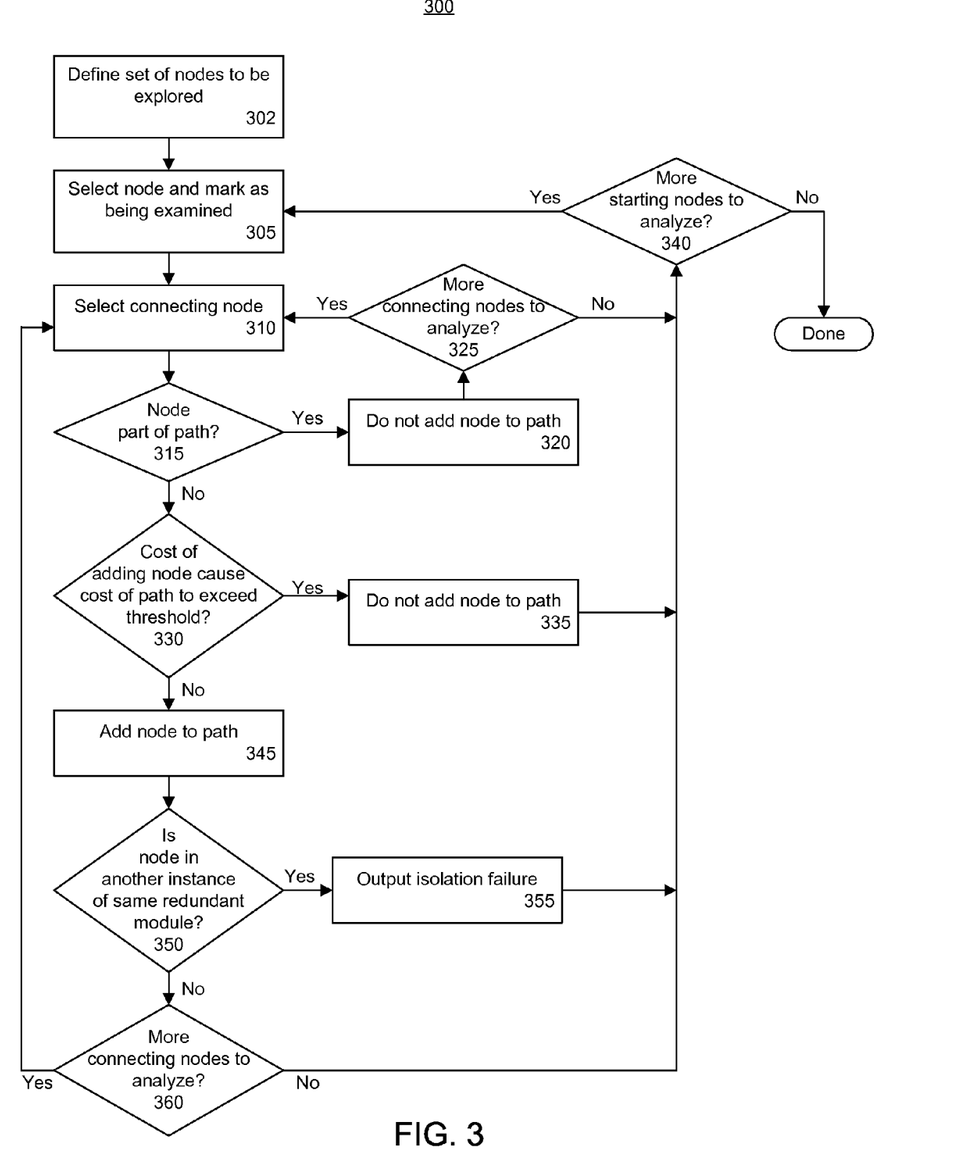
FIG. 3 is a first flow chart illustrating a method of determining whether instances of a redundant module of a circuit design are isolated from one another, in accordance with another embodiment of the present invention.

FIG. 3 is a first flow chart illustrating a method 300 of determining whether instances of a redundant module of a circuit design are isolated, in accordance with another embodiment of the present invention. As is known, a circuit design can be represented in the form of a directed graph, where circuit elements, e.g., switching elements such as transistors or multiplexers, are represented by arcs, and wires are represented by nodes connected by the arcs. In accordance with the embodiments disclosed herein, the graph can be traversed with reference to the underlying device architecture to ensure that each instance of a redundant module is isolated. Method 300 can be performed for each instance of the redundant module.

Method 300 illustrates a simplified example of a depth-limited search of the circuit design. It should be appreciated that this sort of search is but one type of search that can be performed, and that the embodiments disclosed within this specification are not intended to be limited to any particular type of search strategy. In step 302, the set of nodes of the circuit design to be explored can be defined. The set of nodes to be explored, and from which the starting node is selected, can include each node that is within a selected instance of a redundant module of the circuit design. As noted, the clock networks and the power networks for the instance of the redundant module also must be explored. As such, any nodes for clock networks in reference to the circuitry that distributes the clock signals, and any nodes for power networks, in reference to any circuitry that distributes power within the selected instance of the redundant module is included in the set of nodes to be explored.

In step 305, a node of the circuit design can be selected from the set of nodes to be explored as the starting node, and marked as being examined. In general, each path from every node of the selected instance of the redundant module can be constructed until the path is determined to be isolated or the path is determined not to be isolated, resulting in an isolation fault. Within the context of modular redundancy, an isolation fault implies or indicates that at least one instance of a redundant module is not independent of at least one other instance of the same redundant module.

In step 310, a next node, e.g., a connecting node, can be selected. The next node may be connected to the starting node as specified by the circuit design, e.g., within a defined signal path, or may be connected to the starting node only as a result of one or more failures occurring. That is, the "next node" can be one that is not electrically connected to the prior node, as specified within the circuit design, but for the occurrence of a failure. As such, the method selects a next node within the programmable IC. The next node, therefore, need not be a member of the set of nodes to be explored. Such a selection can be made with reference to both the circuit design and the underlying physical circuitry of the programmable IC.

A "failure" can refer to the establishment of a signal pathway that was intended to be blocked. An example of a failure can be a transistor failing and causing a short circuit, a bridge fault, or the failure of some other type of switching circuit element that can establish a connection within the programmable IC that was not intended or specified within the circuit design. A "bridge fault," as used herein, can refer to a defect within a programmable IC that occurs between two routing resources or wires of different nets. For example, two nets that are adjacent to one another may be shorted together, due to a manufacturing defect or the failure of a circuit component such as a transistor or other switching element. In another example, one or both of the nets of an adjacent pair of nets may be open circuits.

In step 315, a determination can be made as to whether the connecting node is already part of the path being constructed from the starting node, e.g., is electrically coupled to the starting node via a defined signal path as specified by the circuit design. If so, the method can continue to step 320, where the connecting node is not added to the current path. The method can loop back to step 325 where a determination is made as to whether there are any further nodes to analyze in terms of forming connections to the starting node. If so, the method can proceed to step 310. If not, the method can proceed to step 340.

Continuing with step 330, where the connecting node is not part of the current path, a determination can be made as to whether the cost of adding the connecting node increases the cost of the current path to a value that exceeds a threshold. In general, the "cost" of a node can refer to a number of failures required for that node to be added to a path, e.g., for a connection to be established from the prior node to the node being considered as the current connecting node. The cost of the current path can be a sum of the costs of each node that is included as part of the current path. Accordingly, when a node is included, or added, to the current path, the cost of that node is added to the cost of the current path.

In one embodiment, the cost of establishing a connection between two nodes can be evaluated in terms of the number of circuit elements or components that must fail in order for a connection, e.g., a short circuit, between the two nodes to occur. For example, a connection between two nodes may require one or more PIPs to fail. Each PIP failure would require a particular number of transistor components to fail. The number of transistors that would have to fail in each PIP to form the connection can be the cost of establishing the connection and adding the connecting node to the current path.

In general, the costs can be determined from a fault analysis of the underlying circuitry of the programmable IC. A cost of zero can be indicative of a short circuit between two nodes. The higher the cost of a connection, the less likely the connection is to experience a fault, since the number of underlying components needed to fail increases with the cost. It should be appreciated, however, that costs can be assigned according to any of a variety of different metrics, and the embodiments described herein are not limited to the examples provided. For example, costs can be weighted or lowered. Further, nodes not analyzed in terms of fault tolerance, or those viewed as more or highly susceptible to fault, can be assigned a zero cost for conservative isolation analysis.

The threshold can be a user specified value or other default value that is set high enough to ensure that the number of circuit components needed to fail for the current path to be established is unlikely. Accordingly, when the cost of a path being formed exceeds the threshold, it is assumed that the path is sufficiently isolated in that the number of component failures that must occur to form the path is considered a remote possibility. Formation of a path beginning in one instance of a redundant module and continuing to a node that is within another instance of the same redundant module, with a cost below the threshold, indicates a potential that neither instance is isolated from the other. This implies a functional dependency between the two instances of the redundant module in which a fault within one instance may cause a fault in the other instance, e.g., a first instance exerts itself upon a second instance thereby influencing the output of the second instance.

Once the cost of the path exceeds the threshold without encountering a node of another instance of the same redundant module, the path need not be explored any further. Accordingly, the method can continue to step 335, where the node is not added to the current path. The method can then continue to step 340 where a determination is made as to whether any further nodes remain to be analyzed for connectivity to the starting node.

Continuing with step 345, where the cost of adding the connecting node to the current path does not cause the cost of the current path to exceed the threshold, the node can be added to the current path. In step 350, a determination can be made as to whether the connecting node is within another instance of the same redundant module. Referring to FIG. 2, for example, when the path begins in instance 210_TR0 and traverses to a node within instance 210_TR1 with a cost not exceeding the threshold, then instance 210_TR0 is not isolated from instance 210_TR1. As noted, when the path traverses from instance 210_TR0 into instance 225_TR1, this condition is not relevant to whether instances 210_TR0, 210_TR1, and 210_TR2 are isolated from one another.

If the connecting node is within another instance of the same redundant module and the current path has a cost of less than the threshold, the method can proceed to step 355, where an isolation failure can be output. The current path has demonstrated that an isolation failure may occur between the instance of the redundant module that includes the starting node and the instance of the redundant module that includes the connecting node. In other words, the path being traversed has left one instance of the redundant module and entered another instance of the same redundant module without having a cost high enough to be considered safe, or unlikely to result in an isolation failure.

The isolation failure can indicate the particular component, path, or instances determined to be problematic in terms of isolation. As used herein, within the context of a computer-implemented process, "outputting" and/or "output" can mean, for example, writing to a file, writing to a user display or other output device, storing in memory, playing audible notifications, sending or transmitting to another system, exporting, or the like. After step 355, the method can proceed to step 340.

When the connecting node does not belong to another instance of the same redundant module, the method can continue to step 360, where a determination can be made as to whether any further nodes remain to be processed in terms of connecting to the starting node. If so, the method can continue to step 310 and continue processing. If not, the method can proceed to step 340 to determine whether any further nodes remain to be examined as starting nodes from the set of nodes to be explored.

In one embodiment, when another starting node is selected, the method can backtrack along the most recent path to locate the first encountered node that has not yet been examined as a starting node. That node can be selected as the starting node in step 305. Nodes can be searched in varying order. For example, all nodes of one instance of a redundant module can be searched prior to moving on to a different instance of the redundant module.

In another embodiment, a node from a different instance of the redundant module can be searched without first searching all nodes of another instance of the same redundant module. Further, various optimizations may be used to avoid redundantly searching paths and/or nodes.

Figure 4:
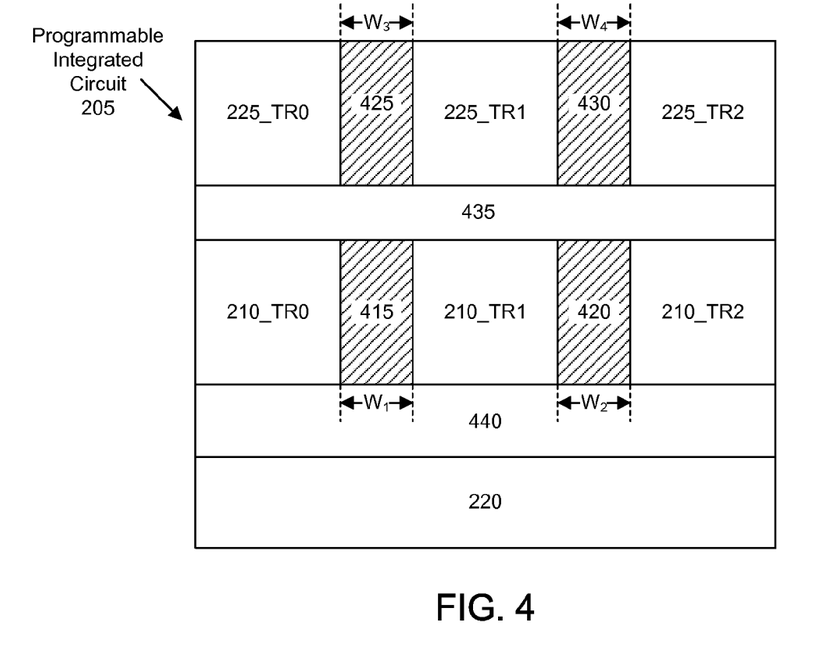
FIG. 4 is a third block diagram illustrating a programmable IC having redundant modules, in accordance with another embodiment of the present invention.

FIG. 4 is a third block diagram that illustrates programmable IC 205 of FIG. 2, in accordance with another embodiment of the present invention. As shown, programmable IC 205 includes redundant module 210 and redundant module 225. FIG. 4 illustrates a case where channels can be used to determine whether instances of a same redundant module are isolated with respect to one another. In the example shown in FIG. 4, the shared circuitry connecting each of instances 210_TR0, 210_TR1, and 210_TR2 to module 220 has been excluded to more clearly illustrate aspects of the embodiments of the invention.

As shown, channel 415 can be disposed, or extend, between the right edge of instance 210_TR0 and the left edge of instance 210_TR1. Similarly, channel 420 can be disposed, or extend, between the right edge of instance 210_TR1 and the left edge of instance 210_TR2. As shown, channel 415 can have a width $W_1$ that specifies the distance between the right edge of instance 210_TR0 and the left edge of instance 210_TR1. Similarly, channel 420 can have a width $W_2$ that specifies the distance between the right edge of instance 210_TR1 and the left edge of instance 210_TR2.

In addition, channel 425 can be disposed, or extend, between the right edge of instance 225_TR0 and the left edge of instance 225_TR1. Similarly, channel 430 can be disposed, or extend, between the right edge of instance 225_TR1 and the left edge of instance 225_TR2. As shown, channel 425 can have a width $W_3$ that specifies the distance between the right edge of instance 225_TR0 and the left edge of instance 225_TR1. Similarly, channel 430 can have a width $W_4$ that specifies the distance between the right edge of instance 225_TR1 and the left edge of instance 225_TR2.

In one embodiment, particular circuit elements can be analyzed to determine whether such circuit elements offer sufficient isolation. The analysis discussed with reference to FIG. 3, for example, may be applied to circuit elements such as CLBs, BRAMs, other logic cells or tiles, standard cells, or the like. Such circuit structures may include multiple wires and/or connections such that the number of component failures needed for the entire block to fail, e.g., short, exceeds the threshold. Such circuit elements may be identified and used as "bright line rules" to separate instances of a redundant module. That is, once fault analysis for a circuit element is performed, it need not be repeated for like circuit elements. Accordingly, when instances of a redundant module are separated by particular circuit elements that have been analyzed and determined to provide a minimum degree of isolation, the instances of the redundant module can be assumed to be properly isolated.

Accordingly, if channel 415 includes selected circuit structures identified as providing the required level of isolation, instance 210_TR0 will be isolated from instance 210_TR1. If channel 420 includes selected circuit structures identified as providing the required level of isolation, instance 210_TR1 will be isolated from instance 210_TR2. If channel 425 includes selected circuit structures identified as providing the required level of isolation, instance 225_TR0 will be isolated from instance 225_TR1. Finally, if channel 430 includes selected circuit structures identified as providing the required level of isolation, instance 225_TR1 will be isolated from instance 225_TR2.

The circuit elements or circuitry forming one or more or all of channels 415, 420, 425, and 430 may be unused or used. In one embodiment, however, no circuit element within channels 415 or 420 may belong to redundant module 210. Similarly, no circuit element within channels 425 or 430 may belong to redundant module 225.

In illustration, channel 415 can be at least one column of CLBs, whether used or unused, or another circuit element identified as providing the required isolation, in width. Similar situations may exist in terms of the widths of each other of channels 420, 425, and 430. Placing selected circuit elements between instances of a redundant module, though applicable in cases where placement and routing information are available, is also useful in cases where the circuit design has not yet been placed or routed. Such analysis is useful because routes, e.g., networks, have not yet been specified. Thus, though the circuit design may not specify detailed information, assignment of instances of a redundant module to regions of a programmable IC, as specified within user constraints, may be evaluated or better planned for future implementation. Accordingly, checking for isolation using bright line rules can aid circuit designers in early stages of system development.

In another embodiment, channels can be evaluated in terms of the number of component failures that must occur to create an isolation failure across the channel. This number of component failures can be compared with a threshold number of component failures. If the number of component failures needed to cross the channel does not exceed the threshold, then an isolation failure can be reported between two instances of a redundant module separated by the channel.

It should be appreciated that a channel separating two instances of a redundant module need not run along a straight line. For example, if two instance of a same redundant module are not rectangles, but, for example, have one or more diagonal or stepped edges, the channel between the two instances can be diagonal rather than vertical or horizontal. Moreover, the channel may be stepped or curved in shape, or follow another contour. In another example, two instances may not share an edge, but rather have two corners separated by some distance, e.g., a channel. In any case, a channel composed of a selected type of circuit element can be used to separate two or more instances of a redundant module from one another.

Another property that can be checked by the analysis tool is whether particular circuit elements with failure rates exceeding some threshold are used, and, if so, where they are used. Isolation criteria may specify that if a circuit element identified as having a failure rate above a threshold is used within the circuit design at a location having a distance less than a predetermined distance from an area of interest, the instance of the redundant module is not isolated. For example, carry chains within a programmable IC may be identified as a potential source of isolation failure. The analysis tool can identify cases where a carry chain, though located within a particular instance of a redundant module, is located too close to a boundary of another instance of the redundant module, as implemented on the programmable IC, to ensure isolation. If the carry chain fails, the independence of the two instances of the redundant module may be compromised. Conditions such as these can be identified as an isolation fault.

As only isolation among instances of a same redundant module is needed, the distance separating instances of different redundant modules need not be considered. Thus, channels 435 and 440, for example, need not be analyzed in terms of width, the separation provided between instances of redundant module 210 and module 220, or the separation provided between instances of redundant module 210 and instances of redundant module 225.

Figure 5:
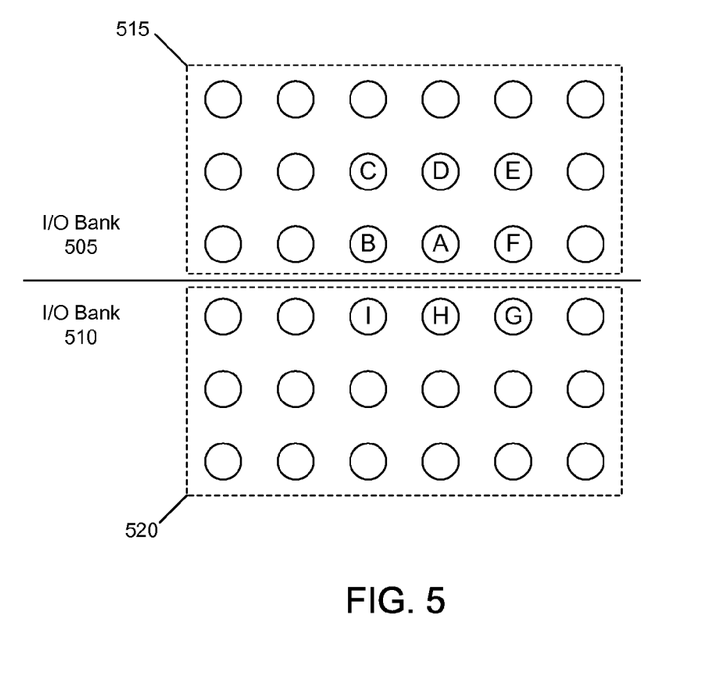
FIG. 5 is a fourth block diagram illustrating input/output (I/O) configurations of a programmable IC, in accordance with another embodiment of the present invention.

FIG. 5 is a fourth block diagram illustrating I/O configurations of a programmable IC, in accordance with another embodiment of the present invention. FIG. 5 depicts two exemplary I/O banks 505 and 510 of a programmable IC. Each I/O bank can include different varieties of I/O devices such as, for example, package pins (pins) and I/O buffers. As pictured, I/O bank 505 can include a plurality of pins 515. I/O bank 510 can include a plurality of pins 520. Each of pins 515 and 520 can be coupled to an I/O buffer (not shown). Those skilled in the art will appreciate that I/O buffers are implemented in silicon and may not have the same configuration or location as the (package) pins coupled to the I/O buffers. For example, an I/O buffer for pin A may not be located next to the I/O buffer for pin F just because the package pins A and F are adjacent to one another.

Other circuit attributes that may be used to determine whether two or more modules are isolated from one another can include the proximity of I/O devices such as pins and/or I/O buffers to one another, as well as the composition of I/O banks. Each signal of the circuit design can be associated with an instance of a redundant module to be implemented within the programmable IC. Signals of the circuit design can be assigned to particular I/O buffers and corresponding pins 515 and/or 520. In that regard, signals also are assigned to particular I/O banks. For example, any signal assigned to one of pins 515 can be said to be in, or associated with, I/O bank 505. Similarly, any signal of the circuit design assigned to a pin 520 can be said to be in, or associated with, I/O bank 510.

Pin proximity relates to the distance between two pins of different instances of a same redundant module. Isolation criteria can specify a minimum distance, e.g., a predetermined number of pins, that should separate pins of different instances of the same redundant module. For example, if one pin is associated with a first instance of a redundant module and an adjacent pin is associated with a second instance of the same redundant module, the two pins may not be considered sufficiently isolated from one another. Accordingly, the first and second instances of the redundant module also are not sufficiently isolated from one another.

Continuing with the example, pin A can belong to the same instance of a given redundant module as each of adjacent pins B, C, D, E, F, G, H, and I. Alternatively, pins B, C, D, E, F, G, H, and I can belong to an instance of a different redundant module or to another module not implemented using modular redundancy. When pin A is a member of a first instance of a redundant module and any one of pins B, C, D, E, F, G, H, or I belongs to a second instance of the same redundant module, pin A is not isolated from the particular pin belonging to the second instance of the redundant module. Consequently, the first instance of the redundant module corresponding to pin A is not isolated from the second instance of the redundant module.

While adjacency has been used to illustrate the proximity of pins, it should be appreciated that the specific distance between pins and/or geometry needed with respect to two or more pins to maintain isolation depends upon the architecture of the programmable IC. For example, it may be the case that isolation can be achieved if a pin of a first instance of a redundant module has no adjacent pins to the left or to the right that belong to a different instance of the same redundant module. Pins immediately above or below, however, from different instances of the same redundant module may be acceptable to maintain isolation. Isolation criteria can specify a distance and/or a direction in which the minimum distance is to be observed. Different distance/direction combinations can be specified with respect to left, right, up, down, and/or diagonal. Any of a variety of isolation criteria can be applied to the pin placement specified in the circuit design to determine whether instances of a redundant module of the circuit design are sufficiently isolated. Such rules will reflect the physical circuitry of the pins for the programmable IC.

A similar analysis can be performed with respect to I/O buffers in terms of distance and/or direction. For example, an I/O buffer associated with one instance of the redundant module should not be located adjacent to, or less than a predetermined distance from, an I/O buffer that is associated with any other instance of the same redundant module, to ensure that each instance of the same redundant module is isolated. Distance may be measured in terms of the number of I/O buffers separating two I/O buffers, for example.

I/O bank composition indicates whether signals from more than one instance of a redundant module of the circuit design have been assigned to pins of a same I/O bank. The particular module, or instance thereof, with which each pin is associated within a given I/O bank can be reviewed to ensure that the I/O bank includes only pins for a single instance of a redundant module. Thus, in some embodiments no I/O bank should include a pin from more than one instance of a same redundant module in order for that instance to be considered isolated.

With reference to I/O bank 505, for example, the signal assignments to pins can be evaluated to ensure that if a signal of an instance of a redundant module is assigned to at least one pin of pins 515, no signal from any other instance of the same redundant module is assigned to a pin of pins 515 within I/O bank 505. Though one or more of pins 515 of I/O bank 505 may be associated with a signal of an instance of a redundant module, one or more of pins 515 may be associated with signals from other modules without sacrificing isolation. For example, with reference to FIG. 4, pins 515 of I/O bank 505 may be assigned to signals of instance 210_TR0 and instance 225_TR0. Pins 515 of I/O bank 505 may not, however, be assigned to signals of instance 210_TR0 and instance 210_TR1.

The pin and I/O buffer criteria described above address the situation in which an isolation failure within a programmable IC occurs and at least one pin from each of at least two different instances of the redundant module are located adjacent to one another. In cases where two or more pins from different instances of the redundant module are located next to one another, a failure in the device, whether malicious or not, may cause a loss of isolation between the pins, thereby defeating the isolation of the instances of the redundant module. The embodiments disclosed herein address this situation by placing an additional barrier between the pins, e.g., by ensuring that two pins of different instances of a same redundant module are not located proximate to one another or have a particular geometry with respect to one another.

It should be appreciated that pin and I/O buffer proximity and I/O bank composition can be analyzed for a circuit design specifying complete placement and routing information as well as for circuit designs that specify user constraints for pin location.

Figure 6:
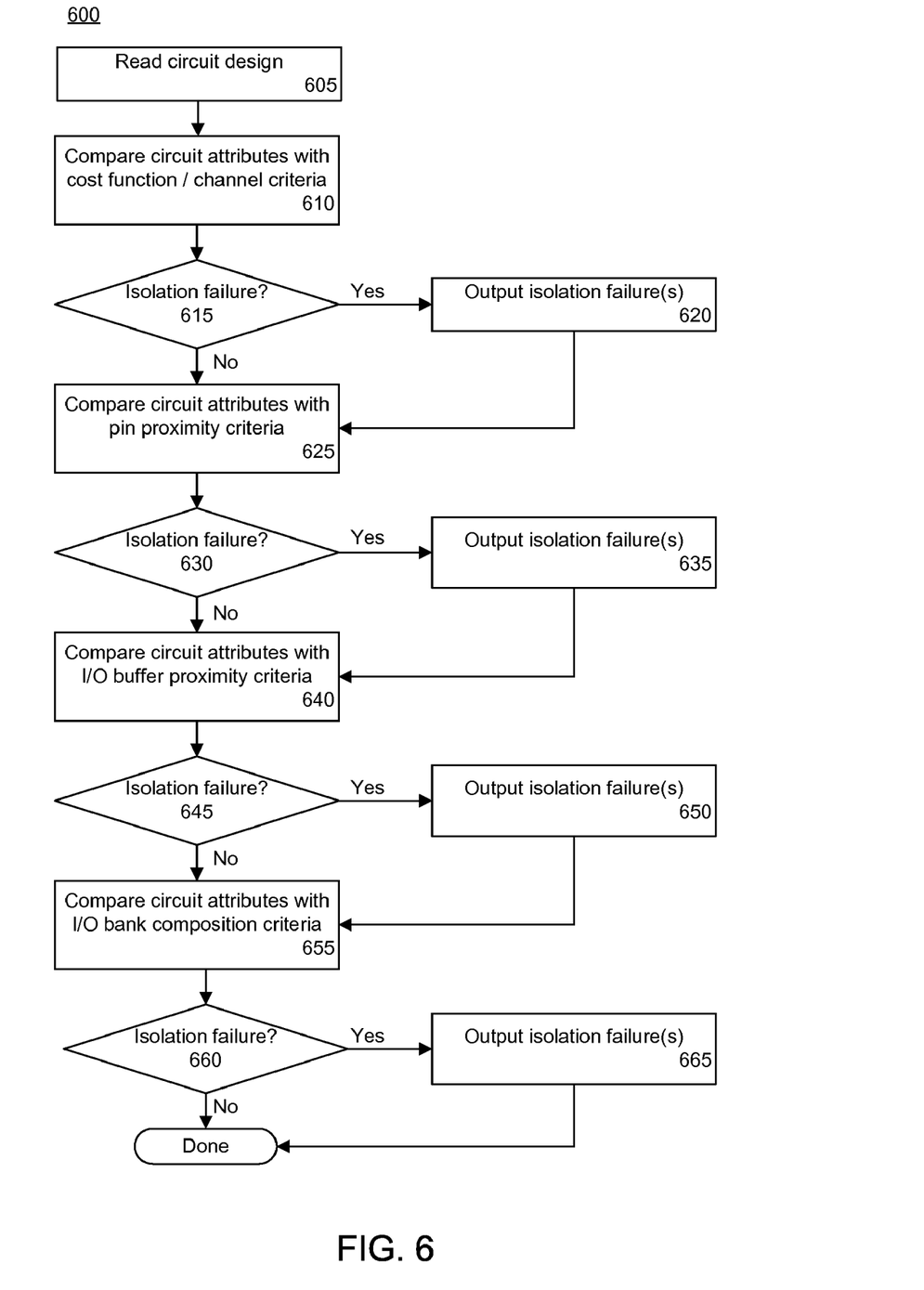
FIG. 6 is a second flow chart illustrating a method of validating isolation of instances of a redundant module of a circuit design, in accordance with another embodiment of the present invention.

FIG. 6 is a second flow chart illustrating a method 600 of validating isolation of instances of a redundant module of a circuit design, in accordance with another embodiment of the present invention. Method 600 can be performed by a software-based analysis tool executing within a computer system, as described herein. Method 600 illustrates a technique for determining whether each instance of a redundant module is, or will be, isolated when implemented within a single programmable IC.

Method 600 can begin in step 605, where a circuit design can be read. The circuit design can specify at least one redundant module. Thus, a plurality of instances of the redundant module can be identified. In one embodiment, the circuit design can specify placement and routing information. In another embodiment, when such information is not fully specified, one or more user constraints specifying module shape and/or placement as well as pin and/or I/O buffer assignments can be read.

In step 610, the analysis tool can identify and compare circuit attributes with isolation criteria to determine whether one or more isolation failures exist, as determined using a cost function or according to whether a channel separating each instance of the same redundant module exists. As noted, either type of analysis can be performed when placement and routing information are available. When placement and routing information are not available, the existence of a channel as described herein can be determined. In step 615, a determination can be made as to whether an isolation failure has been detected. If so, the method can continue to step 620 where the isolation failure(s) can be output.

Beginning in step 625, and continuing to step 645, circuit attributes relating to I/O devices can be evaluated. In step 625, circuit attributes can be identified and compared with isolation criteria relating to pin proximity. As noted, pin proximity refers to the location of pins of each instance of the redundant module with respect to pins of each other instance of the redundant module. The circuit attributes for pin proximity can specify the location to which each pin has been assigned. Accordingly, such circuit attributes can be compared with pin proximity criteria specifying allowable relative locations of pins of different instances of the redundant module with respect to one another. For example, the distance between pins of different instances of the redundant module can be compared with minimum distance and/or direction criteria. In step 630, a determination can be made as to whether an isolation failure has been detected. If so, the method can proceed to step 635 to output the isolation failure(s).

In step 640, circuit attributes can be identified and compared with I/O buffer proximity criteria. As noted, I/O buffer locations can be identified. The circuit attributes, which specify locations of the I/O buffers, can be compared with I/O buffer proximity criteria. In step 645, a determination can be made as to whether an isolation failure has been detected. If so, the method can proceed to step 650 to output the isolation failure(s).

In step 655, circuit attributes can be identified and compared with I/O bank composition criteria. For example, the circuit attributes specifying I/O bank composition can be compared with I/O bank composition criteria specifying that no I/O bank of the programmable IC is to include pins from more than one instance of the redundant module. In step 660, a determination can be made as to whether isolation failure(s) have been detected. If so, the method can continue to step 665, where the isolation failure(s) can be reported or output.

The embodiments disclosed herein provide various techniques for determining whether each instance of a redundant module is isolated from each other instance of that same redundant module. By ensuring isolation among instances of a same redundant module within the same programmable IC, it can be determined that a fault that occurs within one instance of the redundant module is an independent event that will not influence or otherwise corrupt operation of a different instance of that same redundant module.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implement the specified logical functions.

In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware or a combination of hardware and software. The embodiments can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

A computer suitable for storing and/or executing program code can include at least one processor coupled directly or indirectly to memory elements through a system bus. The memory elements can include local memory employed during actual execution of the program code. The memory elements also can include bulk storage and cache memories. For example, cache memories can provide temporary storage of at least some program code in order to reduce the number of times code must be retrieved from bulk storage during execution.

Input/output (I/O) devices such as, for example, keyboards, displays, pointing devices, microphones, speakers, disk storage devices, tape storage devices, other memory devices, etc., can be coupled to the computer either directly or through intervening I/O controllers. Network adapter(s) may also be coupled to the computer to enable the computer to become coupled to other computers, remote printers, storage devices, etc., through intervening private or public networks. Modems, cable modems, and Ethernet cards are just a few of the currently available types of network adapters.

Embodiments of the present invention further can be embedded in a computer program product, which comprises all the features enabling the implementation of the methods described herein. The computer program product can include a computer-usable or computer-readable medium having computer-usable program code which, when loaded and executed in a computer system, causes the computer system to perform the functions described herein. Examples of computer-usable or computer-readable media can include, but are not limited to, optical media, magnetic media, magneto-optical media, computer memory, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A computer-implemented method of verifying isolation of a plurality of instances of a redundant module of a circuit design that is implemented within a single, programmable integrated circuit, the method comprising:
   counting component failures in establishing a connection between at least two different ones of the plurality of instances of the redundant module;
   determining whether each instance of the redundant module is isolated from each other instance of the redundant module according to results of the counting component failures; and
   outputting an indication to indicate whether each of the plurality of instances of the redundant module is isolated according to the results of the counting component failures.

2. The computer-implemented method of claim 1, wherein the counting component failures comprises:
   selecting a node within a selected instance of the redundant module;
   building a path of connecting nodes from the selected node; and
   determining whether the selected instance of the redundant module is isolated according to whether the path comprises a node of an instance of the redundant module other than the selected instance and a cost of the path determined according to a number of component failures required to build the path.

3. The computer-implemented method of claim 2, further comprising, when a cost of the path exceeds a minimum threshold and the path does not comprise a node of an instance of the redundant module other than the selected instance, determining that the path is isolated.

4. The computer-implemented method of claim 2, further comprising, when a cost of the path does not exceed a minimum threshold and the path comprises a node of an instance of the redundant module other than the selected instance, determining that the path is not isolated.

5. The computer-implemented method of claim 1, further comprising determining that a first instance of the redundant module is not isolated at least from a second instance of the redundant module when a package pin of the first instance of the redundant module is within a predetermined distance of a package pin of the second instance of the redundant module.

6. The computer-implemented method of claim 1, further comprising determining that a first instance of the redundant module is not isolated at least from a second instance of the redundant module when an input/output buffer of the first instance of the redundant module is within a predetermined distance of an input/output buffer of the second instance of the redundant module.

7. The computer-implemented method of claim 1, further comprising determining that at least two different instances of the redundant module are not isolated from each other when an input/output bank of the programmable integrated circuit comprises an input/output buffer from the at least two different instances of the redundant module.

8. The computer-implemented method of claim 1, further comprising determining that a first instance of the redundant module is not isolated from a second instance of the redundant module when a selected circuit component, which is disposed within the first instance of the redundant module, is located less than a predetermined distance from a boundary of the second instance of the redundant module.

9. A computer-implemented method of verifying isolation of a plurality of instances of a redundant module of a circuit design that is implemented within a single, programmable integrated circuit, the method comprising:
   determining whether each instance of the redundant module is separated from each other instance of the redundant module on the programmable integrated circuit by a channel comprising at least one isolation characteristic; and
   outputting an indication to indicate whether each of the plurality of instances of the redundant module is isolated according to whether the channel comprises the at least one isolation characteristic.

10. The computer-implemented method of claim 9, further comprising selecting the at least one isolation characteristic to be a number of circuit components spanning a width of the channel that are not members of any of the plurality of instances of the redundant module.

11. The computer-implemented method of claim 9, further comprising selecting the at least one isolation characteristic to be whether the channel comprises a selected type of circuit element that is not a member of any of the plurality of instances of the redundant module.

12. The computer-implemented method of claim 9, further comprising:
   determining whether a package pin of a first instance of the redundant module is within a predetermined distance of a package pin of a second instance of the redundant module; and
   when the package pin of the first instance of the redundant module is within the predetermined distance of the package pin of the second instance of the redundant module, outputting an indication to indicate that the first instance of the redundant module is not isolated from the second instance of the redundant module.

13. The computer-implemented method of claim 9, further comprising:
   determining whether an input/output buffer of a first instance of the redundant module is within a predetermined distance of an input/output buffer of a second instance of the redundant module; and
   when the input/output buffer of the first instance of the redundant module is within the predetermined distance of the input/output buffer of the second instance of the redundant module, outputting an indication to indicate that the first instance of the redundant module is not isolated from the second instance of the redundant module.

14. The computer-implemented method of claim 9, further comprising:
   determining whether an input/output bank of the programmable integrated circuit comprises an input/output buffer from at least two different instances of the redundant module; and
   when an input/output bank of the programmable integrated circuit comprises an input/output buffer from at least two different instances of the redundant module, outputting an indication to indicate that the at least two different instances of the redundant module are not isolated from one another.

15. A computer program product, comprising:
a non-transitory computer-usable medium having computer-usable program code that, when executed by a computer, verifies isolation of a plurality of instances of a redundant module of a circuit design that is implemented within a single, programmable integrated circuit, the non-transitory computer-usable medium comprising:
computer-usable program code that counts component failures in establishing a connection between at least two different ones of the plurality of instances of the redundant module;
computer-usable program code that determines whether each instance of the redundant module is isolated from each other instance of the redundant module according to results of counting the component failures; and
computer-usable program code that outputs an indication to indicate whether each of the plurality of instances of the redundant module is isolated.

16. The computer program product of claim 15, wherein the computer-usable program code that counts component failures comprises:
computer-usable program code that selects a node within a selected instance of the redundant module;
computer-usable program code that builds a path of connecting nodes from the selected node; and
computer-usable program code that determines whether the selected instance of the redundant module is isolated according to whether the path comprises a node of an instance of the redundant module other than the selected instance of the redundant module and a cost of the path determined according to a number of component failures required to build the path.

17. The computer program product of claim 16, wherein the non-transitory computer-usable medium further comprises computer-usable program code that determines that the path is isolated when a cost of the path exceeds a minimum threshold and the path does not comprise a node of an instance of the redundant module other than the selected instance of the redundant module.

18. The computer program product of claim 16, wherein the non-transitory computer-usable medium further comprises computer-usable program code that determines that the path is not isolated when a cost of the path does not exceed a minimum threshold and the path comprises a node of an instance of the redundant module other than the selected instance of the redundant module.

19. The computer program product of claim 15, wherein the non-transitory computer-usable medium further comprises computer-usable program code that determines that a first instance of the redundant module is not isolated from a second instance of the redundant module when an input/output device of the first instance of the redundant module is within a predetermined distance of an input/output device of the second instance of the redundant module.

20. The computer program product of claim 15, wherein the non-transitory computer-usable medium further comprises computer-usable program code that determines that at least two different instances of the redundant module are not isolated when an input/output bank of the programmable integrated circuit comprises an input/output buffer from the at least two different instances of the redundant module.

* * * * *